United States Patent [19]
Schöller

[11] Patent Number: 6,078,217
[45] Date of Patent: Jun. 20, 2000

[54] ELECTROMAGNETIC, COMPATIBLE CLOCKED AMPLIFIER FOR A.C./D.C. CURRENT AMPLIFICATION

[75] Inventor: Kurt Schöller, Hemsbach, Germany

[73] Assignee: Adeo Antriebstechnik GmbH, Mannheim, Germany

[21] Appl. No.: 09/196,401

[22] Filed: Nov. 19, 1998

[51] Int. Cl.[7] .................................................. H03F 3/217
[52] U.S. Cl. ..................... 330/251; 330/207 A; 363/96
[58] Field of Search ................................. 330/10, 207 A, 330/251; 363/96, 135

[56] References Cited

U.S. PATENT DOCUMENTS

| | | | |
|---|---|---|---|
| 4,980,649 | 12/1990 | Gulczynski | 330/251 X |
| 5,880,947 | 3/1999 | Imanaka et al. | 363/96 X |
| 5,963,086 | 10/1999 | Wall | 330/251 X |
| 5,990,654 | 11/1999 | Skibinski et al. | 363/96 X |

*Primary Examiner*—Steven J. Mottola
*Attorney, Agent, or Firm*—Brown & Wood, LLP

[57] ABSTRACT

An electromagnetic, compatible, clocked amplifier for d.c./a.c., current amplification including, for a single phase, a transistor power amplifier having at least one first switching transistor and at least one second switching transistor, and two diodes connected in parallel with respective ones of the first and second transistors; a set value adjuster; an output filter connected with an output of the transistor power amplifier and having at least one current limiting resistor, one filter inductance and one charging capsitor, and two power thyristors polarized in accordance with respective voltage signs and connected in parallel with the current limiting resistor.

2 Claims, 3 Drawing Sheets

ELECTROMAGNETIC, COMPATIBLE CLOCKED AMPLIFIER FOR A.C./D.C. CURRENT AMPLIFICATION

BACKGROUND OF THE INVENTION

1. Field of the Invention

The present invention relates to an electromagnetic, compatible, clocked amplifier for a.c./d.c. current amplification, in particular, to three-phase drive control systems.

2. Description of the Prior Art

It is known to use signal transistors for amplification in end stages of power circuits. It is also known that transistors provide a relatively small collector current upon being switched on and off. It is further known to seriesly connect an inductance with the transistors for limiting the collector current. The inductance is selected so that it adequately limits the transistor current. The drawback of this method of limiting the current consists in that with large currents or power, the inductance and, therefore, the end stage of the power circuit becomes big and heavy. It is also known to use so-called buck-converters with the inductance which is connected in series with the transistors for limiting current in the end stages of the power circuits. Their drawback consists in that they cannot be used for each type of an input signal.

Accordingly, an object of the present invention is to provide a compact, light, electromagnetic, compatible, clocked amplifier for a.c./d.c. current amplification, in particular for three-phase drive control systems, which can amplify any constant or frequency-dependent input signals.

SUMMARY OF THE INVENTION

This and other objects of the present invention, which will become apparent hereinafter, are achieved with an electromagnetic, compatible clocked amplifier for a.c./d.c. current amplification and including, for a single phase, a transistor power amplifier having at least one first switching transistor and one second switching transistor, and two diodes connected in parallel with respective ones of the first and second switching transistors, a set value adjuster, an output fitter connected with an output of the transistor power amplifier and having at least one current limiting resistor, filter inductance, a charging capacitor, and two power thyristors polarized in accordance with respective voltage signs and connected in parallel with the current limiting resistor.

When the first switching transistor of the transistor power amplifier is actuated, the power thyristors, which are connected in parallel with the current limiting resistor, are closed, and the current flows only through the current limiting resistor and the filter inductance. According to the invention, the current limiting resistor and the filter inductance are so dimensioned that the collector current of the first or the second switching transistor, upon actuation of the respective switching transistor, remains limited to an acceptable value. When the first switching transistor is connected through, then, according to the present invention, the power thyristor associated with the first switching transistor is turned on, and the current flows not through the current limiting resistor but through the associated power thyristor. At that, the current, which flows through the switching transistor, increases, in accordance with the coil constant according to equation I=L/R. According to the invention, the voltage after the filter inductance is sensed with a sensor and is transmitted via a signal conductor to a control unit for the first and second transistor. If the voltage after the filter inductance exceeds a predetermined threshold value, the control unit switches off the first switching transistor.

Upon switching off of the first switching transistor, the filter inductance generates an inductive voltage having a sign opposite to that of the voltage after the filter inductance. The inductive voltage resets the power thyristor which was turned on until now. As a result, the inductive current from the current limiting resistor is attenuated and is discharge through a diode connected parallel to the second switching resistor, e.g., the voltage on this side of the filter inductance is sharply discharged through this diode, so that the stored energy can flow in the direction of the charging capacitor or in the direction of a connected load. In order to optimally use the energy content of the filter inductance, in particular when the output current is high, it is advantageous to actuate the reverse conducting power thyristor so that the coil current can flow in the direction of the charging capacitor or the output to a consumer with a maximum intensivity.

If the voltage on the charging capacitor falls below a threshold limit, the first switching transistor is actuated again and the cycle, which was described above, is repeated as long as it is preset in the control unit.

The electromagnetic, compatible, clocked amplifier for a.c./d.c. according to the present invention permits to transmit and amplify both a.c. and d.c., as well as a mixed current in any form and having a frequency up to several hundred herz (cycles). The voltage sensor according to the invention senses an output voltage which is always proportional to the input voltage multiplied by an adjustable amplification factor, independent on whether a load is connected with the output. Only during overload or short circuit, the output voltage does not correspond to the input voltage multiplied by a predetermined amplification factor. According to the present invention, the use, e.g., of at least one current limiting resistor and power thyristors, which are connected parallel with the current limiting resistor, permits to reduce the filter inductance by a factor from 2 to 10, whereby the filter inductance according to the invention is characterized by reduced weight and dimensions. A smaller filter inductance provides for higher switching frequencies of the first and second switching transistors, together with more rapid current and voltage increase. The total weight of the current limiting resistor and the filter inductance is smaller than the weight of the filter resistance alone in the prior art systems.

BRIEF DESCRIPTION OF THE DRAWINGS

The features and objects of the present invention will become apparent, and the invention itself will be best understood from the following detailed description of the preferred embodiments when read with reference to the accompanying drawings, wherein.

DETAILED DESCRIPTION OF THE PREFERRED EMBODIMENTS

Figure 1:
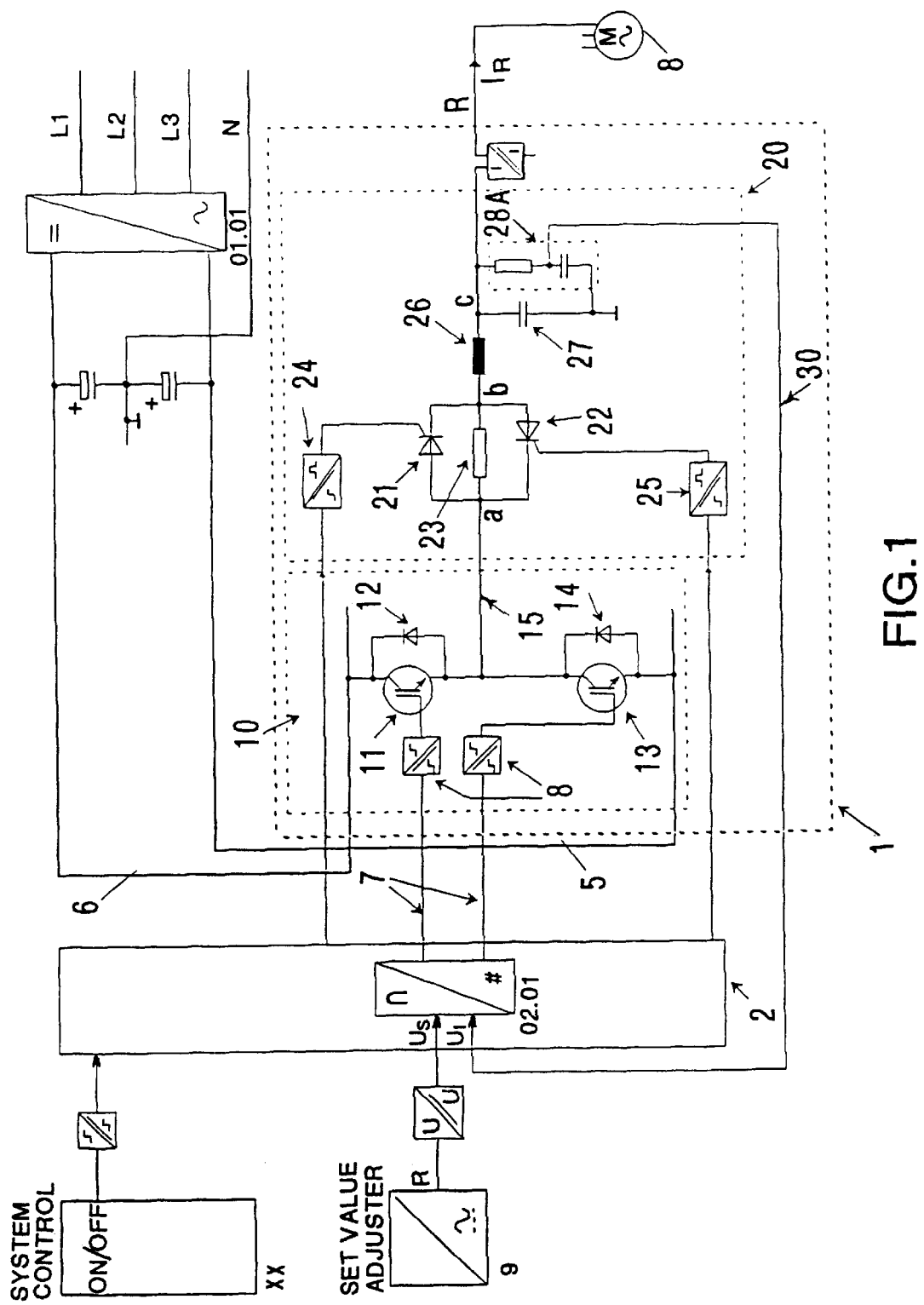
FIG. 1 shows a block-diagram of an electromagnetic, compatible, clocked amplifier for a.c./d.c. current amplification according to the present invention.

An electromagnetic, compatible, clocked amplifier 1 for a.c./d.c. current amplification, in particular, for a three-phase stepped drive control system, has a transistor power amplifier 10, an output filter 20, and a voltage distributor 28. Power is fed to the amplifier 1 via conductors 5 and 6. The electromagnetic, compatible, clocked amplifier 1, which is shown in FIG. 1, is design for one phase. For a three-phase current, the components of the amplifier are tripled. A set value adjuster 9 and a voltage divider 28 communicate, respectively, set values and actual values to a control unit 2. The control signals are fed from the control unit 2 via control conductors 7. In the control unit 2, a two-position controller is provided for each phase. The set value adjuster 9 communicates the set values to the controllers. The set value adjuster can be formed as, e.g., an output of a digitally controlled oscillator such as ePa 96114782.4.

The transistor power amplifier 10 has a first switching transistor 11 and a second switching transistor 13. Each of the first and second transistors 11, 13 is connected in parallel with a respective diode 12, 14. The control unit 2 controls, via the conductor 7, the operation of the switching transistors 11 and 13, i.e., their switching on and off. The first and second switching transistors 11 and 13 are connected, respectively, with the power feed conductors 5 and 6. The transmission direction is from the diode 12 to the conductor 5 and from the diode 14 to the conductor 6. Both first and second switching transistors 11, 13 are connected with the conductor 15.

The conductor 15 is connected with an output filter 20 including seriesly connected current limiting resistor 23, filter inductance 26, and input or charging capacitor 27. Power thyristors 21, 22 which are polarized in accordance with the voltage sign, are connected parallel with the current limiting resistor 23. The power thyristors 21, 22 are controlled by the control unit 2 via respective trigger elements 24, 25. A voltage divider 28 is arranged between the filter inductance 26 and the charging capacitor 27. The voltage divider 28 can be connected with a load or a consumer 8, e.g., a synchronous motor.

Operation of the electromagnetic, compatible, clocked amplifier 1 will now be described.

Actuation of the power thyristor 22, in case of a load-free control, i.e., when no load is connected with the output, is not necessary. Thereby, simply a short voltage increase at a voltage measuring point 26c takes place. Whether during a no-load operation, the set value level is reached, at a transient condition, in 5, 10 or 20 $\mu$sec., should not play any role in this case. Thus, during the no-load operation, the switching function of the power thyristors 21, 22 can be completely dispensed with.

A voltage of, e.g., +200v is applied to the conductor 5, and a voltage of −200v is applied to the conductor 6. Input signals with a level between +4v and −4v, which should be amplified by an adjustable factor, which is preset in the control unit 2, are applied to the control unit 2.

The following example relates to an amplification at a constant level, when no load should be connected with the output.

Figure 2:
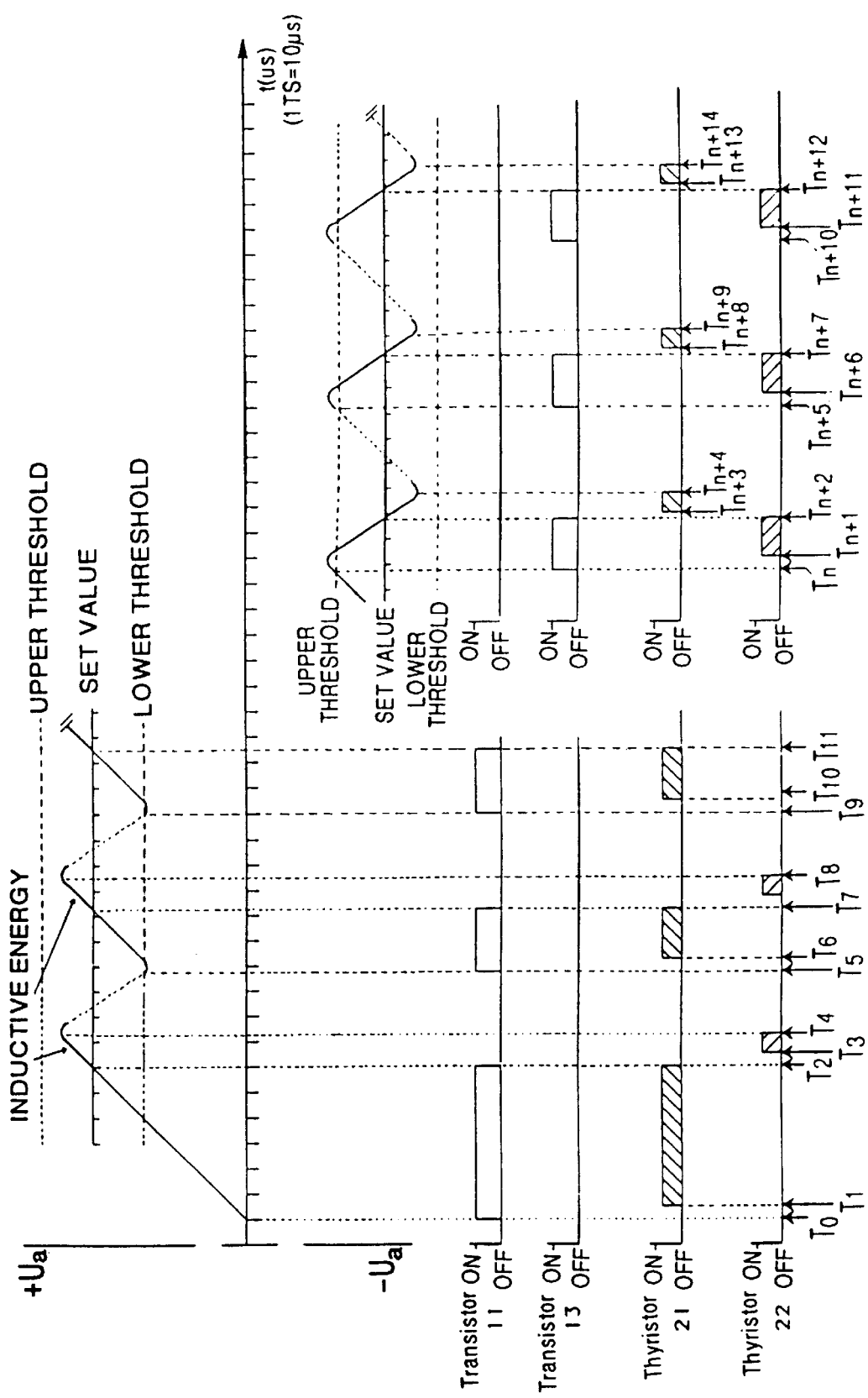
FIG. 2 shows an amplification diagram dependent on conditions of switch transistors and power thyristors.

With reference to the left diagram of FIG. 2, when an input signal should be amplified by a positive factor, the control unit 2 switches the first switching transistor 11 on to a conductive state by time To. The current flows from the conductor 5 through the first switching transistor 11, the current limiting resistor 23, the filter inductance 26 in the charging capacitor 27. After a characteristic switch-on time period of about 2 $\mu$sec for the first transistor 11, by a time $T_1$, the power thyristor 21 is actuated by the control unit 2, and the current flows through the power thyristor 21, the filter inductance 26 and in the charging capacitor 27. The current through the first transistor 11 increases only proportionally to the constants of the filter inductance 26. By time $T_2$, a voltage is measured at the voltage divider 28, which is arranged between the filter inductance 26 and the charging condensator 27, and is directed to the control unit 2 via a conductor 30. At the time $T_2$, the control unit 2 switches the first transistor 11 off. Simultaneously, countervoltage, which is induced by the filter inductance 26, resets the power thyristor 21.

The voltage on the voltage divider 28 only slightly exceeds the threshold value. The actuation of the power thyristor 21 in case of a load-free control, i.e., when no load is connected with the output, is not necessary. Thereby, simply a short voltage increase period at the voltage measuring point 26c is achieved. Whether during a no-load operation, the set value level is reached, at a transient condition in 5, 10, or 20 $\mu$uses, should not play any role, and the switching function of the power thyristors 21, 22 can completely be dispensed with.

With reference to the right diagram of FIG. 2, when an input signal should be amplified by a negative factor, the control unit 2 switches the second switching transistor 13 onto a conductive state by time Tn. The current flows from the conductor 6 through the second switching transistor 13, the current limiting resistor 23, the filter inductance 26 in the charging capacitor 27. After a characteristic switch-on time period of about 2 $\mu$sec. for the second transistor 13, by a time $T_{n+z}$, the power thyristor 22 is actuated by the control unit 2, and the current flows through the power thyristor 22, the filter inductance 26 and in the charging capacitor 27. The current through the second transistor 13 increases only proportionately to the constants of the filter inductance 26. By time $T_{n+2}$, a voltage is measured at the voltage divider 28, which is arranged between the filter inductance 26 and the charging condensator 27, and is directed to the control unit 2 via a conductor 30, at the time $T_{a+2}$, the control unit 2 switches the second transistor 13 off. Simultaneously, countervoltage, which is induced by the filter inductance 26, resets the power thyristor 22.

The voltage on the voltage divider 28 only slightly exceeds the adjusted set value. Immediately after expiration of time $T_{n+5}$, the second transistor 13 is again switched on, and the power thyristor 22 is actuated after a time lag $T_{n+6}$ until the threshold value is reached on the voltage divider 28, and so on . . .

The following example related to an amplification of a sinusoidal output signal when, again, it is assumed that no load is connected with the output.

When a sinusoidal input signal should be amplified by a positive factor, the control unit 2 switches the first switching transistor 11 on. The current flows from the conductor 5 through the first switching transistor 11, the current limiting resistor 23, the filter inductance 26 in the charging capacitor 27. After a characteristic switch-on time period of about 2 $\mu$sec for the first transistor 11, the power thyristor 21 is actuated by the control unit 2, and the current flows through the power thyristor 21, the filter inductance 26 and in the charging capacitor 27. The current through the first transistor 11 increases only proportionally to the constants of the filter inductance 26. A voltage is measured at the voltage divider 28 between the filter inductance 26 and the charging condensator 27, and is directed to the control unit 2 via a conduit 30. After a threshold value is reached, the control unit 2 switches the first transistor 11 off. Simultaneously, counter voltage, which is induced by the filter inductance 26, resets the power thyristor 21.

The voltage on the voltage divider 28 only slightly exceeds the actual set value. When the voltage on the charging capacitor 27 falls again, the first transistor 11 is switched on, and the power thyristor 22 is actuated after a predetermined time lag until the set value reaches the value of the actual input signal on the voltage divider 28, and so on . . .

When the sinusoidal input signal reached a maximum value, and an input signal with a smaller amplitude is communicated by the set value adjuster 9, the input signal should be amplified by a negative factor. At that, the control unit 2 switches the second switching transistor 13 on. The current flows from the conductor 6 through the second switching transistor 13, the current limiting resistor 23, the filter inductance 26 in the charging capacitor 27. After a characteristic switch-on time period of about 2 per $\mu$sec for for the second transistor 13, the power thyristor 22 is actuated by control unit 2, and the current flows through the power thyristor 22, the filter inductance 26 and in the charging capacitor 2. The current through the second transistor 13 increases only proportionally to the constants of the filter inductance 26 until a voltage is measured at the voltage divider 28 between the filter inductance 26 and the charging condensator 27, and is directed to the control unit 2 via a conductor 30. Then, the control unit 2 switches the second transistor 13 off. Simultaneously, countervoltage, which is induced by the filter inductance 26, resets the power thyristor 22. The actuation of the power thyristor 22 in case of a load-free control, i.e.m when no load is connected with the output is not necessary. Thereby, simply a short voltage increase period at the voltage measuring point 26c is achieved. Whether during a no-load operation, the set value level is reached, at a transient condition in 5, 10 or 20 per 8,25 $\mu$sec should not play any role so that during idle operation, the switching function of the power thyristor 21, 22 can be completely dispensed with.

The voltage on the voltage divider 28 only slightly exceeds the set value. When the voltage on the charging capacitor 27 falls below a respective set value, the second switching transistor is actuated again, and the power thyristor 22 is actuated after a predetermined time lag until the upper set value is reached at the voltage divider 28, and so on.

When an alternating voltage with a connected load need be amplified, a mutual use of the power thyristors 21, 22 takes a particular importance. In this case, periodical, different current loads occur which can vary from 0 amper up to a maximum current. In the region of small currents, predominantly at the zero crossing, the switching function of both power thyristors 21, 22 can advantageously be dispensed with, as it has already been discussed above. This is because the loading energy is limited, and the power thyristors are only actuated at a certain strength of the current.

When the sinusoidal input signal reached a minimal value, and an input signal with a greater amplitude is communicated by the set value adjuster 9, the sinusoidal input signal should be amplified, as described above, by a positive factor, and so on . . .

When the load 8 is connected with the output, the current flows to the load 8, influencing the voltage level on the voltage divider 28. Because the voltage divider 28 presets the values, in accordance with which the control unit 2 controls the first and second transistors 11, 13 and the associated power thyristors 21, 22, the load can change the above-discussed sequence of switching on of the first and second transistors 11, 13 and the associated power thyristors 21, 22.

Figure 3:
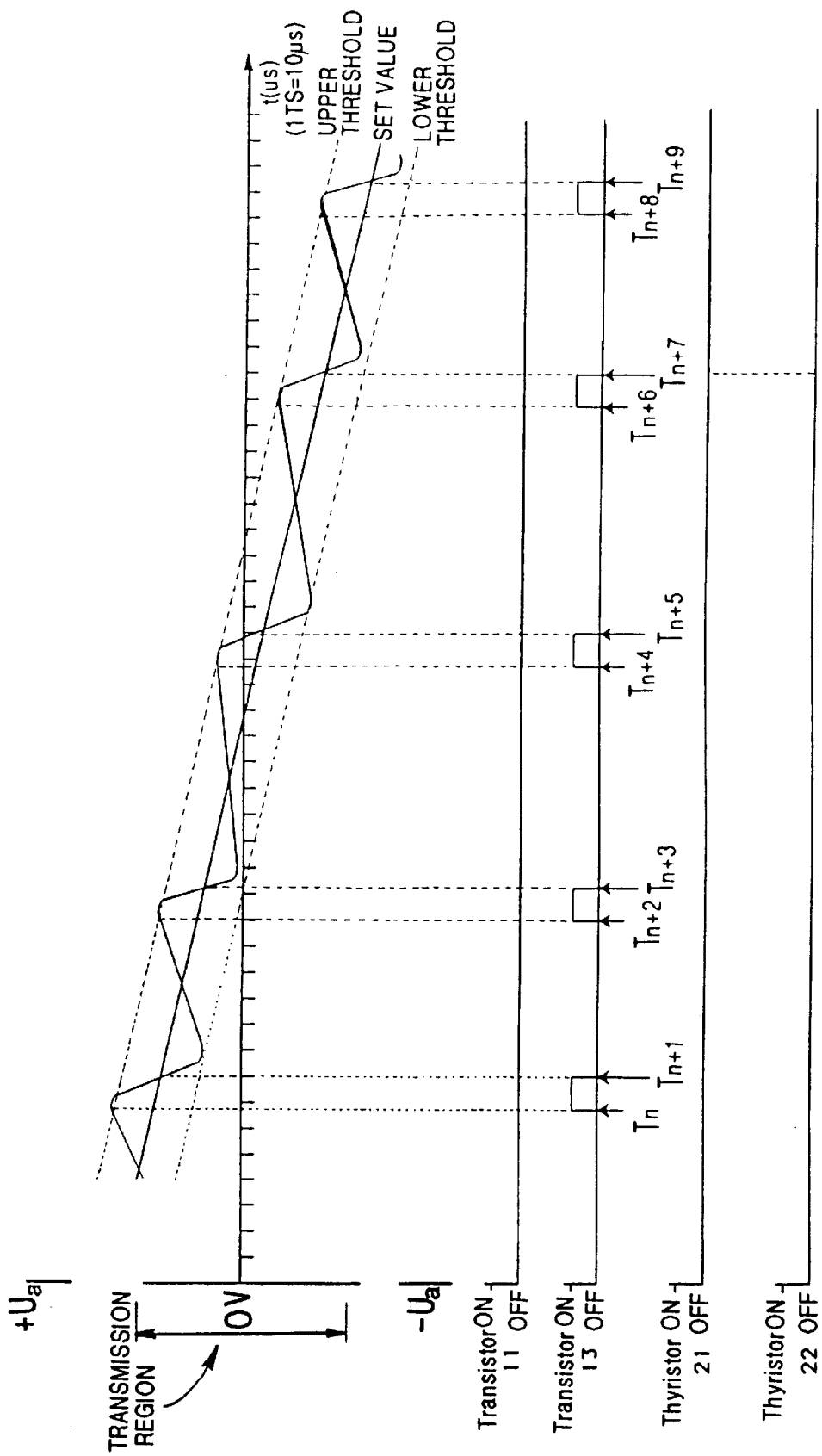
FIG. 3 shows an amplification diagram of small currents dependent on conditions of switch transistors.

As shown in the diagram in FIG. 3, with small currents and an amplification from a positive factor to a negative factor, the current amplification function results from switching on the transistor 13 at time $T_n$ and switching off the transistor 13 at time $T_{n+1}$. After the threshold is slightly exceeded, the current amplification functions turns from the lower threshold value backs to the upper threshold value, with the switching of the second transistor 13 on and off being repeated. The power thyristors 21, 22 are not actuated until the current value reaches, e.g., 20% of the maximum current value.

Though the present invention was shown and described with references to the preferred embodiments, various modifications thereof will be apparent to those skilled in the art and, therefore, it is not intended that the invention be limited to the disclosed embodiments or details thereof, and departure can be made therefrom within the spirit and scope of the appended claims.

What is claimed is:

1. An electromagnetic, compatible, clocked amplifier for d.c./a.c. current amplification, comprising, for a single phase:

a transistor power amplifier comprising at least one first switching transistor and one second switching transistor, and two diodes connected in parallel with respective ones of the first and second switching transistors;

a set value adjuster;

an output filter connected with an output of the transistor power amplifier and having at least one current limiting resistor, filter inductance, and charging capacitor; and two power thyristors polarized in accordance with respective voltage signs and connected in parallel with the current limiting resistor.

2. An amplifier as set forth in claim 1, wherein the power thyristors are actuated only when current reaches at least 20% of the maximum current.

\* \* \* \* \*